United States Patent
Meyer et al.

(10) Patent No.: US 7,326,592 B2
(45) Date of Patent: Feb. 5, 2008

(54) STACKED DIE PACKAGE

(75) Inventors: Torsten Meyer, Erlangen (DE); Harry Hedler, Germering (DE)

(73) Assignee: Infineon Technologies AG, Munich (DE)

( * ) Notice: Subject to any disclaimer, the term of this patent is extended or adjusted under 35 U.S.C. 154(b) by 201 days.

(21) Appl. No.: 11/098,780

(22) Filed: Apr. 4, 2005

(65) Prior Publication Data
US 2006/0220262 A1 Oct. 5, 2006

(51) Int. Cl.
*H01L 21/782* (2006.01)
(52) U.S. Cl. .................. 438/110; 438/113; 438/126; 257/723
(58) Field of Classification Search .............. 438/110, 438/113, 126
See application file for complete search history.

(56) References Cited

U.S. PATENT DOCUMENTS

| 5,422,435 A | 6/1995 | Takiar et al. |
| 5,495,398 A | 2/1996 | Takiar et al. |
| 5,502,289 A | 3/1996 | Takiar et al. |
| 2003/0015803 A1 | 1/2003 | Prietzsch |
| 2003/0038374 A1* | 2/2003 | Shim et al. .................. 257/777 |
| 2004/0051170 A1* | 3/2004 | Kawakami et al. ......... 257/686 |
| 2004/0227250 A1* | 11/2004 | Bolken et al. .............. 257/777 |

FOREIGN PATENT DOCUMENTS

EP 0 575 051 B1 7/1999

* cited by examiner

*Primary Examiner*—Steven Loke
*Assistant Examiner*—Earl Taylor
(74) *Attorney, Agent, or Firm*—Slater & Matsil, L.L.P.

(57) ABSTRACT

A stacked die package includes a substrate or interposer board that includes a contact area on a top surface and landing pads surrounding the contact area. Solder pads are disposed on an opposite side of the substrate. The solder pads are electrically connected with the landing pads by inner board wiring. A reconstituted die, which includes a die surrounded by a frame, is mounted over the substrate. A top die is mounted over the reconstituted die. Both the reconstituted die and the top die are electrically connected to the substrate, e.g., by wire bonds.

19 Claims, 6 Drawing Sheets

STACKED DIE PACKAGE

TECHNICAL FIELD

The invention relates to a stacked die package with integrated circuits such as memory devices or controllers.

BACKGROUND

The development of the application of integrated circuits shows that more complex functions are to be realized but there are limitations of the number of functions realizable on a single chip. Therefore, technologies for stacking of two or more dies with several functions and methods for the mechanical and electrical interconnection with one another or with a base substrate which is the basis for stacking and for mounting on a PCB (Printed Circuit Board) have been developed.

Several technologies for contacting different chips are known. Conventional technologies are using chip and wire bonding for contacting the dies electrically. These are known processes with well-known parameters. Using these technologies for stacked dies (FBGA: fine ball grid array) the chips are placed one over another and the contacts of the dies are connected with corresponding contact pads on the substrate by wire loops performed by bonding.

For this wire bonding it is necessary to reroute the bond pads, which are typically arranged in a row at the die center, to the edge of the die, to avoid long wire bond loops (electrical performance). The rerouting (redistribution layer, RDL) is typically a metal line made of copper (basis metal), nickel (covering layer) and gold (suitable for contacts). It can be built by electro- or electroless plating.

According to FIG. 1 (prior art), a first die 1 is bonded to the substrate or interposer board 2 by chip bonding. This can be performed by positioning an adhesive 3 between the first die 1 and the substrate 2. Such adhesive 3 can be a tape with an adhesive coating on both sides. Then the bond pads 4 of the first die 1 are connected with contact pads 5 on the substrate with wire loops 6 by wire bonding.

Now a distance element or spacer 7 must be mounted on the top side of the first die 1. This is possible with known technologies like die bonding with adhesive 8 or a tape. The spacer 7 is necessary for protecting the wire loop 6 between the bond pad 4 on the first die 1 and the contact pad 5 on the substrate 2. The spacer 7 can be a silicon die, an adhesive tape with a sufficient thickness or any other suitable material, but the dimensions of the spacer 7 must be smaller than the dimensions of the die 1.

After this step, a next die 9 can be mounted on the spacer 7 with adhesive 10 or tape and then the same connecting procedure must be performed like for the first die 1 including connecting the bond pads 11 on the second die 9 with contact pads 5 on the substrate 2 by wire loops 12. The stacked structure is now protected (backside- and edge protect) by a mold encapsulant 13. The substrate 2, opposite the stacked dies 1, 9 is provided with solder balls 14 which are electrically connected (normally soldered) to the contact pads 5 on the substrate 2.

It seems to be clear that this is a very expensive technology (serial processes with high accuracy), even in case that more than two dies are stacked.

The high number of interfaces (due to the spacer) results in a lower processing yield. Additionally, the top die has to be bonded on overhang, which is a critical process for very thin dies. These are needed because the absolute height of the package is increased by the spacer, but the height restrictions of stacked packages nevertheless have to be fulfilled. Furthermore, the reliability (e.g., moisture resistance) is a critical aspect due to the high number of interfaces if a spacer is used in a wire-bonded stacked package.

An example for a package of semiconductor chips is known from U.S. Patent Application Publication 2003/0015803 A1. The semiconductor chips have identical dimensions and are spaced apart by spacers of smaller lateral dimensions, preventing the chip from directly contacting to the neighbor and allowing wire-bonding of each of the stacked chips to the bonding pads on a carrier.

Another stacked multi-chip module and a method for manufacturing a stacked multi-chip module is described in EP 0 575051 B1. According to this document, a first element (die) is mounted on a substrate by using an adhesive material. A second element (die) is mounted to the first again by using an adhesive material. The third die should be at least partially supported by the second die and the second die should be at least partially supported by the first die. Furthermore, the second die is positioned such that the electrical contacts are exposed and accessible for making fine wire connections thereto. Likewise, the third die may be positioned such that electrical contacts of the second die are exposed and accessible for making fine wire connections thereto. Although the upper dies are progressively smaller in size.

The problem of this prior art is that the dies must be equal in size but it is possible to stack very thin dies.

SUMMARY OF THE INVENTION

In one aspect, the present invention overcomes the limitations of the prior art and simplifies the assembly technology.

In another aspect, the invention increases the reliability of a stacked die package by decreasing the number of interfaces within the package.

In a further aspect, the invention decreases the total height of the package or increases the number of chips in the package with maintaining the total package height.

According to an embodiment of the invention, the bottom die can be modified in advance to die bonding to provide additional area around the silicon edge. That way the use of a spacer is not needed. The bottom die is embedded in a polymer material by molding (reconstitution) resulting in a frame around the die. This frame is a fan-out area, the chip area is now larger than the bare silicon of the die. The redistribution line that is used to distribute connections from the pads on the chip to the edges of the die package can be elongated to the edge of the frame. The position for the bond wire interconnect is transferred to the edge of the frame as well. That way the bottom die on the substrate is provided with a larger area than a next die, which can be die bonded with an adhesive at the top side of the first reconstituted die. The area out of the die shadow of the upper die can now used to connect the first die with the substrate or the bottom die by wire bonding.

The result is that a spacer is no longer necessary, all process steps, necessary for assembling the spacer can be left out. This leads to lower packaging costs and less reliability issues due to a reduced number of material interfaces.

Another feature of the invention is that more dies can be stacked at a given total height, or the total package height of two stacked dies can be reduced.

One feature of the preferred embodiment of the invention is a reconstituted die, surrounded by a polymer. A surrounding rim is performed, protecting the backside and the edge of the silicon die, and not covering the active side of the die. It is possible to provide bond pads outside the silicon area (fan-out) on the RDL.

The reconstituted chip is produced in the well-known wafer-level technology. Front-end tested good dies after dicing are picked up and placed face down on an adhesive tape with any distance from each other (fan-out area). Then, the dies on the tape are reconstituted to a reconstituted wafer-by-wafer molding with the mentioned polymer.

An RDL is formed (e.g., sputter and plate) from the center row bond pads to the edge of the reconstituted die on the wafer. At the edge of the polymer embedded die, this RDL is used as new bond pad for the wire bond to the substrate.

After applying the RDL, the reconstituted wafer is diced into individual reconstituted dies, each provided with a polymer frame. With this rerouting of the bond pads, it is possible to stack dies with a minor basic (fan-out) area (as the bottom reconstituted die) or standard front-end dies on the reconstituted bottom die. Therefore, only an adhesive without any spacer is needed.

It is also possible to stack dies with originally equal dimensions due to the provided frame, which is increasing the dimension of the bottom die.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
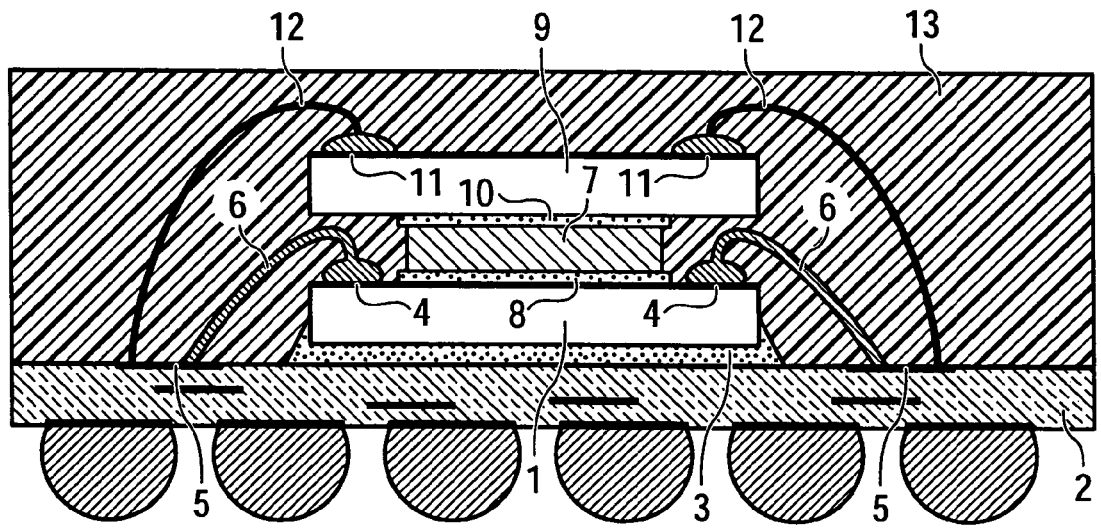
FIG. 1 illustrates stacked dies on an interposer board according to the prior art.
Figure 2:
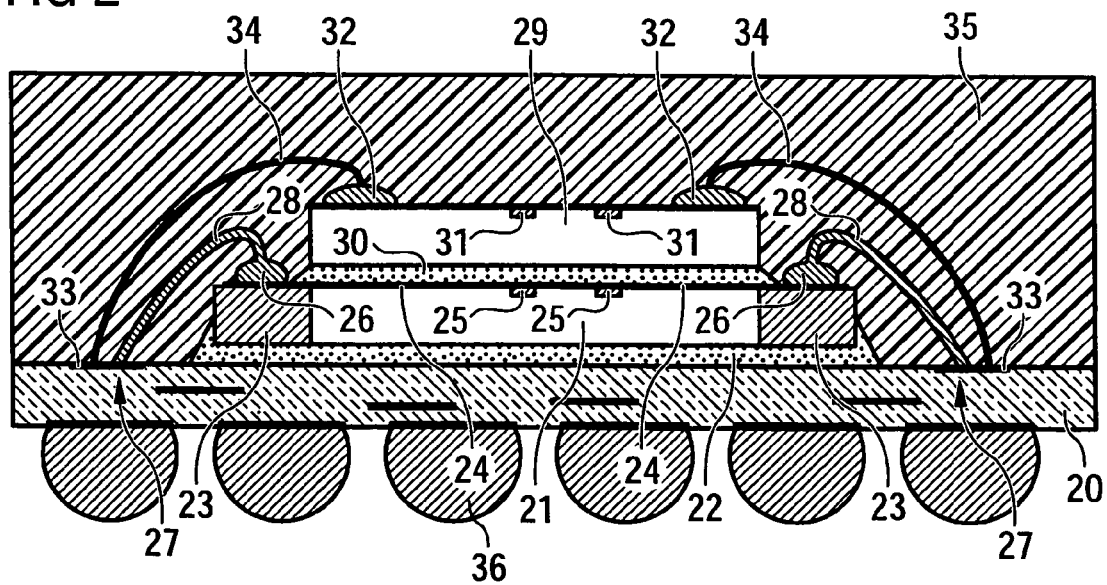
FIG. 2 illustrates an embodiment of stacked dies according to a preferred embodiment of the invention with a reconstituted die on an interposer board and a second die mounted on the reconstituted die.

FIG. 2 illustrates an embodiment of the invention with an interposer board 20 with a reconstituted die 21 mounted on the interposer board 20. The reconstituted die 21 is mounted on the interposer board 20 by a liquid adhesive 22 or an adhesive tape 22. The reconstituted die 21 is provided with a frame 23 to increase the die area (fan-out) to the mentioned reconstituted die 21. The top or active surface of the reconstituted die 21 is provided with RDL layer 24, which reroute the bond pads 25 arranged in a center row on the reconstituted die 21 to wire bond pads 26 positioned on the frame 23. The wire bond pads 26 can be connected with landing pads 27 on the interposer board 20 by wire loops 28. This interconnection can also take place in a later step after assembly of the top die(s).

Then a second die 29 is die bonded on the top surface of the reconstituted die 21 with an adhesive glue or tape 30. This die 29 can also be a reconstituted die with a smaller fan-out area than the bottom die for stacking three or more dies, or it is a front-end-chip without fan-out area, but with an RDL. The second die 29, and all following dies, is also provided with an RDL to reroute the bond pads 31 arranged in a center row to wire bond pads 32 on the rim of the second die 29. These wire bond pads 32 are connected with landing pads 33 on the interposer board 20 or to the bond pads of the chip below by wire loops 34. The arrangement with the two stacked dies is surrounded by an encapsulant 35 so that the wire loops 28, 34 are protected.

The interposer board 20 is provided with solder balls 36 at the bottom side, which are connected with the landing pads 27, 33.

Figure 3A:
FIGS. 3a to 3h show the manufacturing steps to realize reconstituted dies.
Figure 3B:

FIGS. 3a to 3h show the simplified manufacturing steps to realize reconstituted dies 21. To start, a carrier plate 40, which can be a silicon wafer or another suitable plate is provided. This plate 40 is necessary only temporarily. The plate 40 is illustrated in FIG. 3a. A releasable adhesive tape 41 is mounted on the carrier plate, as shown in FIG. 3b.

Figure 3C:
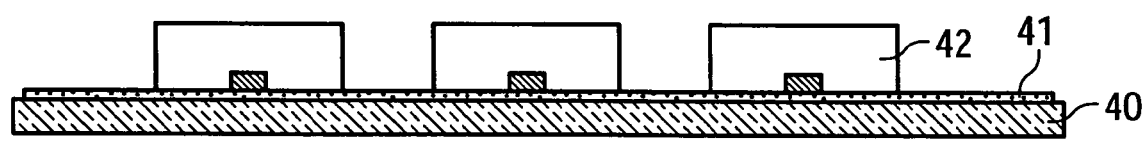
Figure 3D:
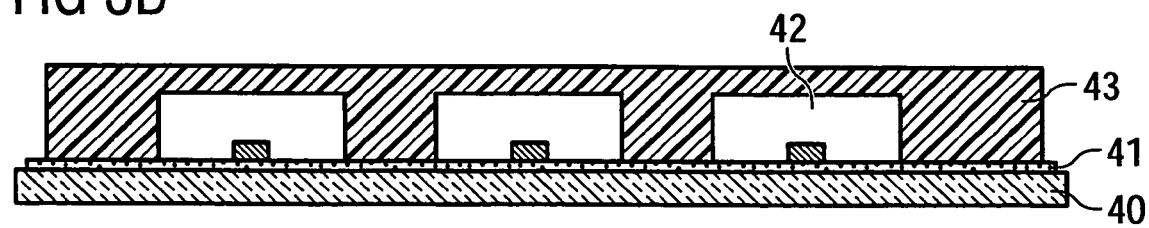

Referring to FIG. 3c, front-end tested good dies 42 are placed on the adhesive 41 with sufficient gaps between each other (fan-out area) with the active side in direction to the carrier plate. The backside and the edges of the placed dies are now molded to a reconstituted wafer, a mold encapsulant, 43 by wafer molding, as shown in FIG. 3d. In this manner, each die 42 is surrounded by a frame 44.

Figure 3E:
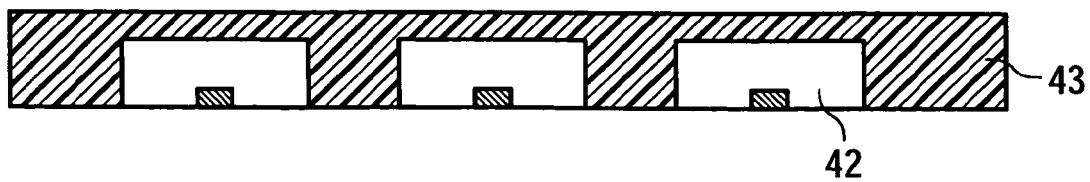
Figure 3F:
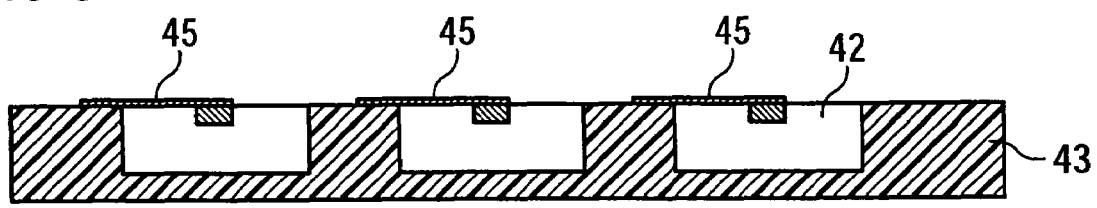
Figure 3G:
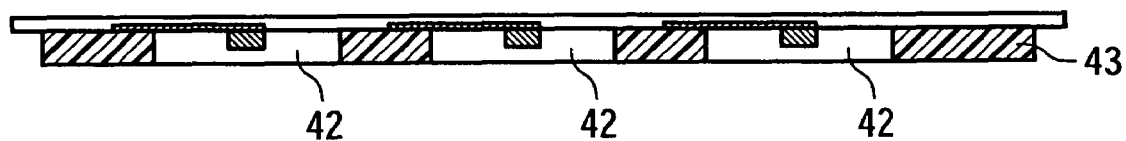
Figure 3H:
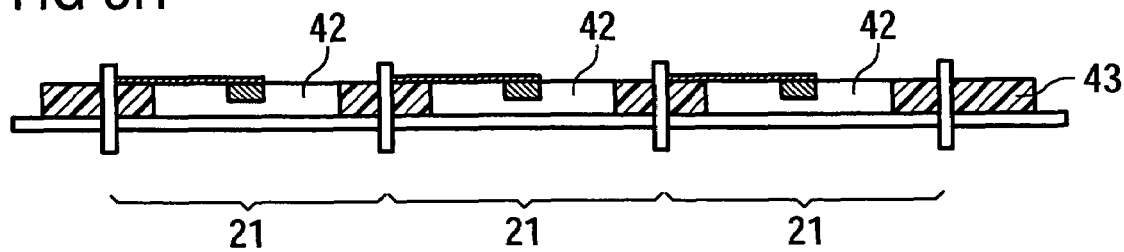

After this molding step the carrier plate 40 can be removed as shown in FIG. 3e. FIG. 3f illustrates the simplified step of applying the RDL 45 on the active surface of the die 42 over the interface between the chip and surrounding polymer frame 44 by sputtering, lithography and plating. The RDL can also be electroless plated or printed with any conductive material. Then a backside grinding of the die 42 is possible to remove mold compound from the backside of the dies and to decrease the thickness of the dies 42. This is shown in FIG. 3g. Referring to FIG. 3h, the reconstituted dies 21 are now separated by dicing in a way that each die 42 is surrounded by an individual frame 49.

Figure 4A:
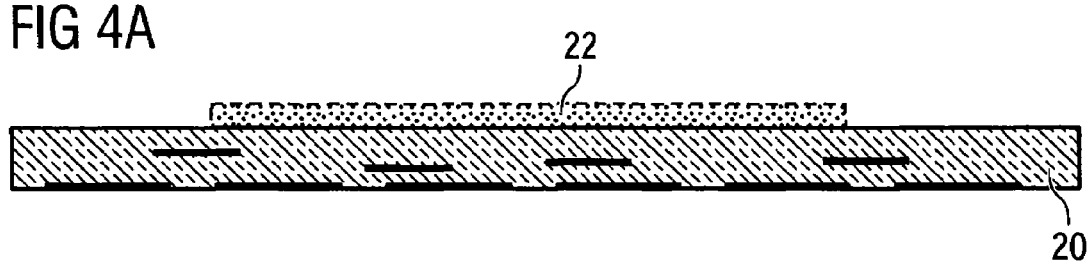
FIGS. 4a to 4f illustrate the process flow for stacking dies according to a preferred embodiment of the invention.
Figure 4B:
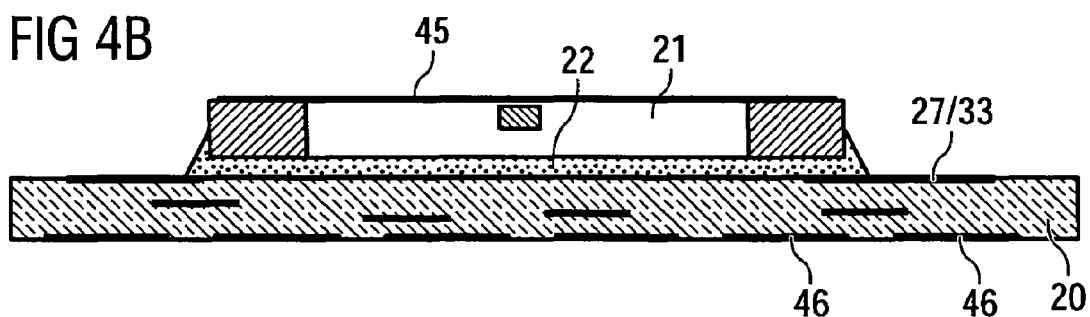
Figure 4C:
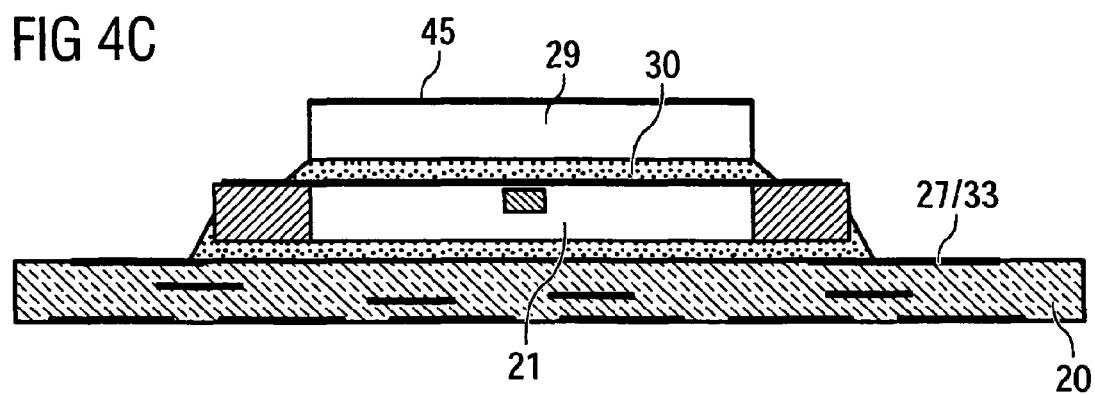

FIGS. 4a to 4f illustrate the simplified process flow for stacking of two dies according an embodiment of the invention by way of cross sections. Referring first to FIG. 4a, an interposer board 20 is provided with a die adhesive or adhesive tape 22 on its top surface at the area at which a reconstituted die 21 should be die bonded. The adhesive can be printed or the tape can be laminated in a separate step before die bonding. The interposer board is provided with landing pads 27, 33 and solder pads 46 for applying solder balls 36 (shown in FIG. 4f). The reconstituted die 21 (e.g., according FIG. 3) is die bonded to the interposer board 20.

Figure 4D:
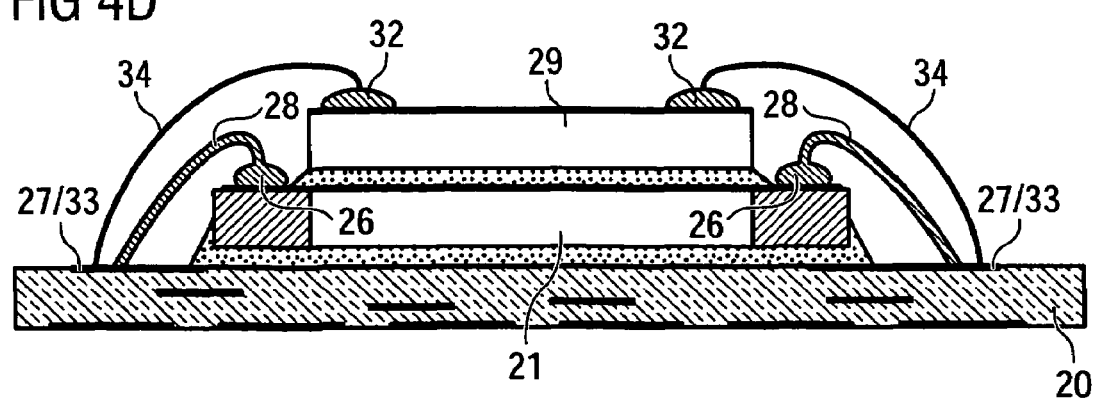

Another adhesive layer or adhesive tape 30 is applied on the bottom die by printing, dispensing or any other technique. The next die 29 with a smaller outer dimension than the reconstituted die below 21 is die bonded now on the die below. This die 29 can be another reconstituted die or a standard front-end silicon die without fan-out area. Now the bond pads 26, 32 are connected with the landing pads 27, 33 by wire loops 28, 34, respectively. The dies can be connected as shown in FIG. 4d or the top die 29 can be connected with the die below, and this die can afterwards be connected with the interposer board 20. This bonding technique is well known and saves space in lateral dimensions. Only the chip select connection must be bonded separately between the dies.

Figure 4E:
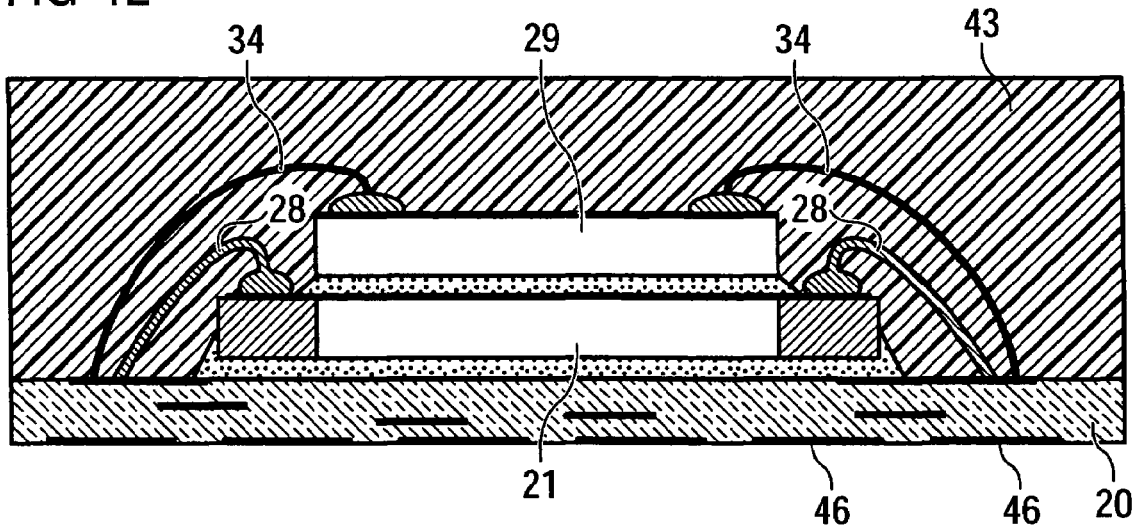
Figure 4F:
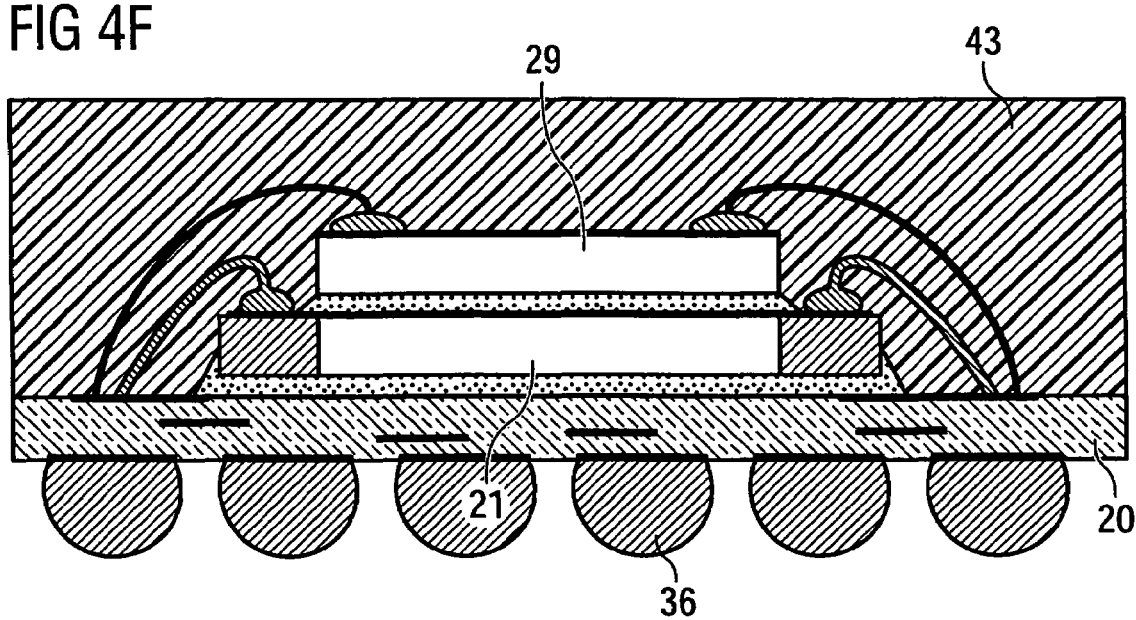

FIG. 4e shows the stacked die assembly according to FIG. 3 after molding with a mold encapsulant 43 for mechanical protection of the silicon dies 21, 29 and wire loops 28, 34. Solder balls 36 are assembled as seen in FIG. 3f.

Figure 5:
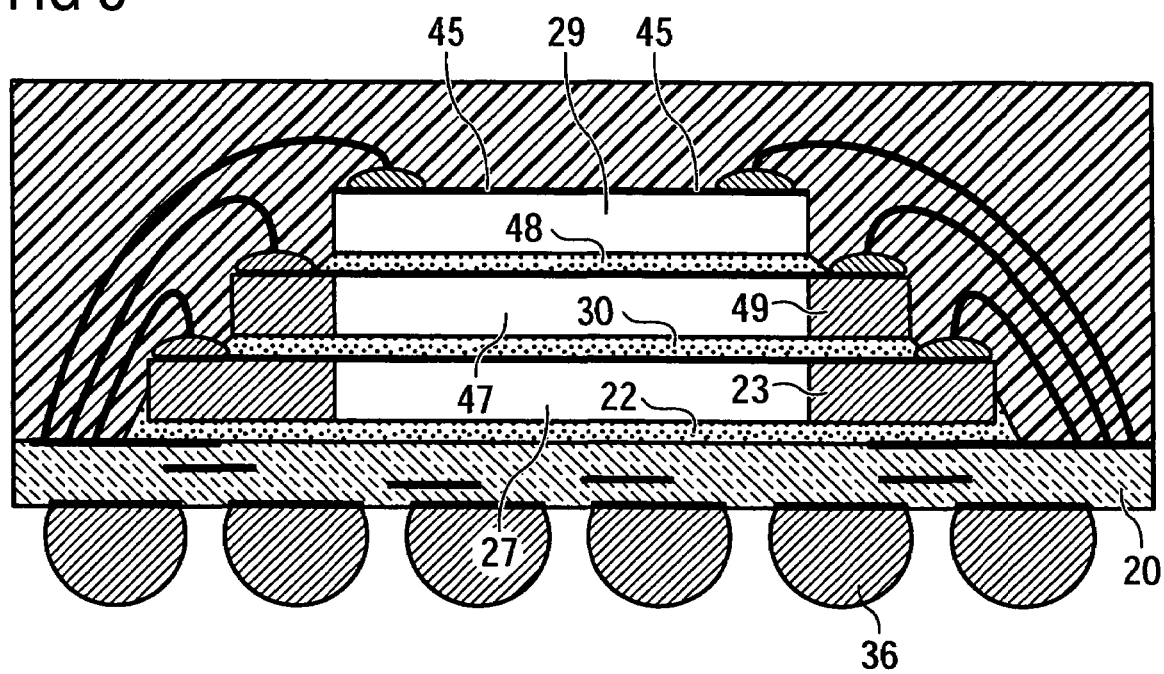
FIG. 5 illustrates an example with three dies stacked on a substrate and each of the stacked dies electrically connected with the interposer board.

FIG. 5 shows an example with three dies 21, 29, 47 stacked on a substrate 20. The dies 21, 47 are reconstituted dies according FIG. 3h and the reconstituted die 47 has smaller dimensions than the reconstituted die 21. The frame 49 (fan-out area) of the reconstituted die 47 is smaller than the frame 23 of the reconstituted die 21. The top die 29 can be a bare die without any frame but provided with an RDL 45 or a reconstituted die as well. The lateral dimensions of the dies must shrink from bottom to top, so that wire bonding is possible from each level to the landing pads 27, 33 on the interposer board. The electrical connections are performed similar to FIG. 4d.

It is noted that the number of stacked dies is not limited.

In each of the above-described embodiments, an RDL 45 was provided to redistribute center bond pads to the peripheral of the chip. It is understood, however, that concepts of the present invention apply to chips that include bond pads formed at the peripheral. For these chips, the RDL 45 may not be necessary or may be necessary only to redistribute peripheral pads on the die to the frame 23. As a result, the invention applies equally to embodiments that do not include an RDL.

What is claimed is:

1. A method of forming an electronic component, the method comprising:
   providing a substrate, the substrate comprising a contact area on a top surface of the substrate and landing pads surrounding the contact area, the substrate further comprising solder pads on a bottom surface of the substrate, the solder pads being electrically connected with the landing pads by inner board wiring;
   providing a reconstituted die that includes a die surrounded by a frame, wherein the reconstituted die includes a redistribution layer (RDL), routing from center row bond pads on the die to wire bond pads on the frame;
   mounting the reconstituted die over the substrate; and
   mounting a top die over the reconstituted die.

2. The method according to claim 1, wherein mounting the reconstituted die comprises using an adhesive between the reconstituted die and the substrate and wherein mounting the top die comprises using a second adhesive between the reconstituted die and the top die.

3. The method according to claim 1, further comprising coupling wire loops between bond pads on the reconstituted die and the landing pads on the substrate and also between bond pads on the top die and the landing pads on the substrate.

4. The method according to claim 1, wherein the frame comprises a polymer or metal material.

5. The method according to claim 1, further comprising coupling first wire loops between the wire bond pads on the frame of the reconstituted die and the landing pads on the substrate and coupling second wire loops between bond pads on the top die and the landing pads on the substrate.

6. The method according to claim 5, further comprising encapsulating the reconstituted die, the top die and the first and second wire loops in a mold compound.

7. The method according to claim 1, wherein the substrate comprises an interposer board.

8. The method according to claim 1, further comprising:
   providing a second reconstituted die that includes a second die surrounded by a second frame, the second reconstituted die being smaller than the reconstituted die but larger than the top die; and
   mounting the second reconstituted die mounted over the reconstituted die, the top die being mounted over the second reconstituted die.

9. The method according to claim 1, wherein providing a reconstituted die comprises manufacturing the reconstituted die.

10. A method of forming an electronic component, the method comprising;
    providing a substrate, the substrate comprising a contact area on a top surface of the substrate and landing pads surrounding the contact area, the substrate further comprising solder pads on a bottom surface of the substrate, the solder pads being electrically connected with the landing pads by inner board wiring;
    manufacturing a reconstituted die that includes a die surrounded by a frame, wherein manufacturing the reconstituted die comprises;
       providing a carrier plate with an adhesive on its surface,
       placing dies on the adhesive leaving gaps between adjacent dies,
       wafer molding the placed dies with a mold encapsulant such that the gaps between the dies are filled with the encapsulant,
       removing the carrier plate,
       forming a redistribution layer over an active surface of each die, and
       separating the dies to form reconstituted dies by dicing such that each die is surrounded by an individual frame, the reconstituted die being one of the reconstituted dies;
    mounting the reconstituted die over the substrate; and
    mounting a top die over the reconstituted die.

11. The method of claim 10, further comprising backside grinding of the dies prior to separating the dies.

12. The method of claim 10, wherein placing dies comprises placing front-end tested good dies.

13. The method of claim 10, wherein a backside of each die is overmolded during the wafer molding.

14. The method of claim 10, wherein the gaps between adjacent ones of the dies comprise gaps of varying sizes.

15. The method of claim 10, further comprising electrically connecting the reconstituted die to the substrate.

16. The method of claim 15, further comprising electrically connecting the top die to the substrate.

17. The method of claim 15, wherein electrically connecting the reconstituted die to the substrate comprises wirebonding from bonding pads on the reconstituted die to landing pads on the substrate.

18. The method of claim 17, wherein the bonding pads are disposed over a frame portion of the reconstituted die, the frame portion comprising the encapsulant.

19. The method of claim 10, wherein the adhesive comprises a releasable adhesive.

\* \* \* \* \*